(12) United States Patent
Pfeuffer et al.

(10) Patent No.: US 9,917,230 B2
(45) Date of Patent: Mar. 13, 2018

(54) OPTOELECTRONIC SEMICONDUCTOR CHIP

(71) Applicant: OSRAM Opto Semiconductors GmbH, Regensburg (DE)

(72) Inventors: Alexander F. Pfeuffer, Regensburg (DE); Norwin von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/315,376

(22) PCT Filed: Jun. 12, 2015

(86) PCT No.: PCT/EP2015/063204
§ 371 (c)(1),
(2) Date: Nov. 30, 2016

(87) PCT Pub. No.: WO2015/189406
PCT Pub. Date: Dec. 17, 2015

(65) Prior Publication Data
US 2017/0200861 A1    Jul. 13, 2017

(30) Foreign Application Priority Data
Jun. 13, 2014   (DE) .................... 10 2014 108 373

(51) Int. Cl.
*H01L 29/49*    (2006.01)
*H01L 33/38*    (2010.01)
(Continued)

(52) U.S. Cl.
CPC ............ *H01L 33/382* (2013.01); *H01L 33/22* (2013.01); *H01L 33/387* (2013.01); *H01L 33/405* (2013.01); *H01L 33/46* (2013.01)

(58) Field of Classification Search
CPC ...... H01L 33/387; H01L 33/405; H01L 33/46
See application file for complete search history.

(56) References Cited

U.S. PATENT DOCUMENTS 8,716,724 B2 *   5/2014   von Malm ............ H01L 27/156
257/88
8,956,897 B2    2/2015   Rode et al.
(Continued)

FOREIGN PATENT DOCUMENTS

DE    102008030584 A1    12/2009
DE    102012108763 A1    3/2014
(Continued)

*Primary Examiner* — Michael Shingleton
(74) *Attorney, Agent, or Firm* — Slater Matsil, LLP

(57) ABSTRACT

An optoelectronic semiconductor chip is disclosed. In an embodiment the chip includes a semiconductor layer sequence having a bottom face and a top face, wherein the semiconductor layer sequence comprises a first layer of a first conductivity type, an active layer for generating electromagnetic radiation, and a second layer of a second conductivity type and a bottom contact element located at the bottom face and a top contact element located at the top face for injecting current into the semiconductor layer sequence. The chip further includes a current distribution element located at the bottom face, the current distribution element distributes current along the bottom face during operation and a plurality of vias extending from the current distribution element through the first layer and through the active layer into the semiconductor layer sequence, wherein the vias are not in direct electrical contact with the active layer.

16 Claims, 5 Drawing Sheets

(51) Int. Cl.
*H01L 33/22* (2010.01)
*H01L 33/40* (2010.01)
*H01L 33/46* (2010.01)

(56) References Cited

U.S. PATENT DOCUMENTS

| | | |
|---|---|---|
| 9,741,912 B2 * | 8/2017 | Hoeppel ............ H01L 33/60 |
| 2008/0191215 A1 | 8/2008 | Choi et al. |
| 2015/0236206 A1 | 8/2015 | Gaertner et al. |

FOREIGN PATENT DOCUMENTS

| | | | |
|---|---|---|---|
| EP | 2355177 | A2 | 8/2011 |
| EP | 2357679 | A2 | 8/2011 |

* cited by examiner

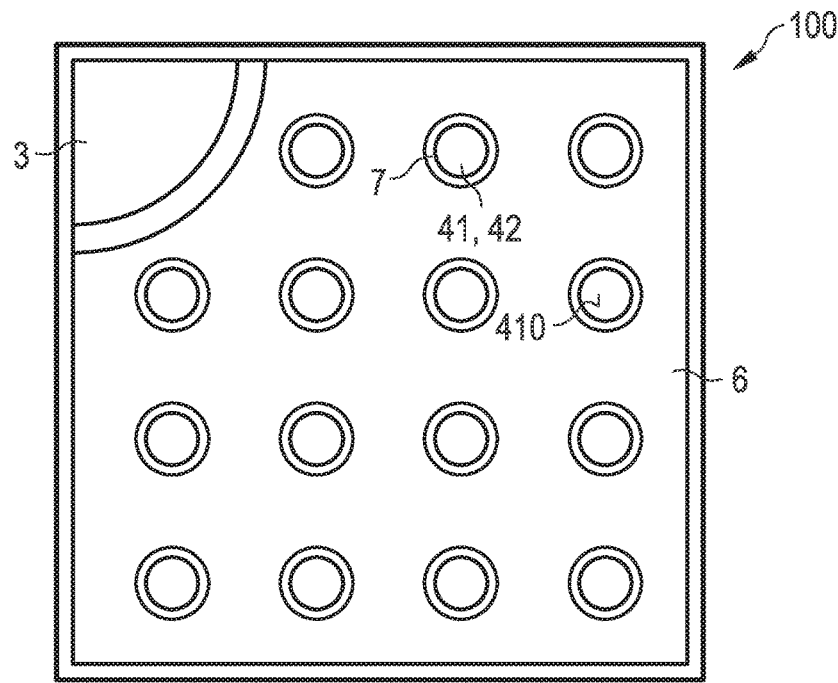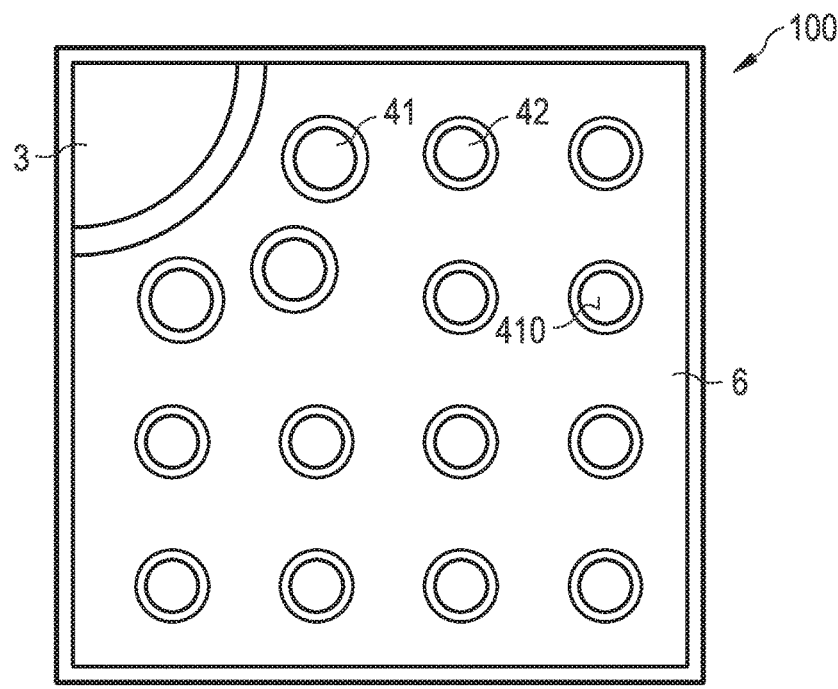

OPTOELECTRONIC SEMICONDUCTOR CHIP

This patent application is a national phase filing under section 371 of PCT/EP2015/063204, filed Jun. 12, 2015, which claims the priority of German patent application 10 2014 108 373.3, filed Jun. 13, 2014, each of which is incorporated herein by reference in its entirety.

TECHNICAL FIELD

An optoelectronic semiconductor chip is defined.

SUMMARY OF THE INVENTION

Embodiments of the present invention define a particularly efficient semiconductor chip that is particularly resistant to aging.

According to at least one embodiment, the semiconductor chip comprises a semiconductor layer sequence having a bottom face and a top face, which is opposite the bottom face.

The semiconductor layer sequence is preferably based on a III-V compound semiconductor material. For example, the semiconductor material is a nitride compound semiconductor material such as $Al_nIn_{1-n-m}Ga_mN$, or a phosphide compound semiconductor material such as $Al_nIn_{1-n-m}Ga_mP$, or even an arsenide compound semiconductor material such as $Al_nIn_{1-n-m}Ga_mAs$, where in each case $0 \leq n \leq 1$, $0 \leq m \leq 1$ and $n+m \leq 1$.

The semiconductor layer sequence can also comprise dopants and additional constituents. For the sake of simplicity, however, only the essential constituents of the crystal lattice of the semiconductor layer sequence are specified, i.e., Al, As, Ga, In, N or P, even if small amounts of other substances may be used in place of and/or in addition to some of the constituents. The semiconductor layer sequence is preferably based on AlInGaN.

The semiconductor layer sequence comprises at least one active layer, which is designed to generate electromagnetic radiation. The active layer contains in particular at least one pn-junction and/or at least one quantum well structure. Radiation generated by the active layer during operation in particular lies in the spectral range between 400 nm and 800 nm inclusive.

According to at least one embodiment, the semiconductor layer sequence comprises a first layer of a first conductivity type, the active layer, and a second layer of a second conductivity type, in this order viewed from the bottom face.

According to at least one embodiment, a bottom contact element is applied to the bottom face of the semiconductor layer sequence. A top contact element is then applied to the top face. The top contact element and/or the bottom contact element are preferably each Ohmic conductors and are used for injecting current into the semiconductor layer sequence. The bottom and/or the top contact element are, for example, in indirect, preferably direct, contact with the semiconductor layer sequence. The top and/or the bottom contact element can, for example, comprise or be made of a metallic material such as gold, silver, aluminum, platinum, titanium or an alloy of these materials. In addition, the contact elements can also comprise or be made of a transparent conductive oxide. These oxides, known as TCO for short, are normally metal oxides such as, for instance, zinc oxide, tin oxide, cadmium oxide, titanium oxide, indium oxide or indium tin oxide (ITO). Aluminum zinc oxides (AZO) or indium zinc oxides (IZO) are also possible. In addition, the contact elements can comprise both a metal and a TCO, for example, the contact elements then have a multilayer design comprising at least one metallic layer and at least one TCO layer.

According to at least one embodiment, a current distribution element is applied to the bottom face of the semiconductor layer sequence. The current distribution element is intended in particular to distribute current during operation along the bottom face of the semiconductor layer sequence, preferably to distribute the current uniformly.

According to at least one embodiment, a plurality of vias extend from the current distribution element through the first layer and the active layer into the semiconductor layer sequence. For instance the vias are in direct contact with the current distribution element, so that current can flow between the current distribution element and the vias without having to pass through further materials. The current distribution element and the vias can comprise or be made of the same or different materials.

In particular, the vias do not pass through the semiconductor layer sequence entirely, but terminate in the semiconductor layer sequence. In this case, the vias are preferably not in direct electrical contact with the active layer. This means in particular that current cannot flow from the vias to the active layer without having to travel through further layers, for instance further semiconductor layers. For this purpose, an insulating material, for example, can be arranged between the vias and the active layer. Current can be carried by means of the vias from the bottom face of the semiconductor layer sequence to the second layer of the semiconductor layer sequence without the current having to flow through the semiconductor material of the active layer.

According to at least one embodiment, current is injected into the semiconductor layer sequence by means of the top contact element during operation. At least some of the current can then be conducted towards the bottom face via first vias of the vias. At the bottom face, the current distribution element distributes the current preferably along the bottom face. Then the current can be conducted via second vias of the vias towards the top face, where it is re-injected into the semiconductor layer sequence.

The vias and/or the current distribution element are preferably Ohmic conductors. In particular, the resistances of the vias and/or of the current distribution element parallel or perpendicular to the active layer equals only a fraction of the resistance of the semiconductor layer sequence, for instance at most $1/100$ or at most $1/10000$ or at most $1/1000000$ thereof. The resistance of the current distribution element in a direction parallel to the bottom face equals at most $1/100$ or at most $1/10000$ or at most $1/100000$ of the resistance of the semiconductor layer sequence in a direction parallel to the bottom face.

In at least one embodiment, the optoelectronic semiconductor chip comprises a semiconductor layer sequence having a bottom face and a top face, which is opposite the bottom face. The semiconductor layer sequence comprises a first layer of a first conductivity type, an active layer for generating electromagnetic radiation, and a second layer of a second conductivity type, in this order viewed from the bottom face. Furthermore, the semiconductor chip comprises a bottom contact element applied to the bottom face, and a top contact element applied to the top face, for injecting current into the semiconductor layer sequence. Also applied to the bottom face is a current distribution element, which during operation distributes current along the bottom face, and from which a plurality of vias extend through the first layer and through the active layer into the semiconductor layer sequence. In this case, the vias are not in direct electrical contact with the active layer. During operation, at least some current injected by means of the top contact element into the semiconductor layer sequence is conducted towards the bottom face by means of first vias of the vias. Here, the current is distributed by the current distribution element and is conducted via second vias of the vias towards the top face, where the current is then re-injected into the semiconductor layer sequence.

The present invention in particular makes use of the idea of defining an optoelectronic semiconductor chip to which contact is made both from the top face and from the bottom face. Since the electromagnetic radiation generated in the semiconductor layer sequence is meant to be coupled out preferably via the top face, the top, preferably metallic, contact element must absorb only a small amount of radiation. Thus the top contact element should preferably cover only a small area of the top face. In order to achieve nonetheless a good current distribution inside the semiconductor layer sequence, current injected into the semiconductor layer sequence via the top contact element is first conducted by means of vias to the bottom face of the semiconductor layer sequence, here distributed along the bottom face by means of a current distribution element, and then conducted by means of the vias back towards the top face, where the current is re-injected into the semiconductor layer sequence. Distribution of the current, which is needed for homogeneous light emission from the semiconductor chip, is thus performed mainly on the bottom face of the semiconductor layer sequence.

According to at least one embodiment, at least some of the vias are made in the form of holes in the semiconductor layer sequence. This means in particular that in a lateral direction parallel to the active layer, the vias can be surrounded partially or entirely by a material of the semiconductor layer sequence. For example, the vias are cylindrical in shape, with part or all of the lateral surface of the vias being formed by the semiconductor material.

The vias are preferably filled with a conductive material for the purpose of current conduction. In particular, the conductive material may comprise or be made of a reflective metal such as silver, aluminum, gold or titanium.

According to at least one embodiment, the current distribution element is embodied as a layer applied to the bottom face. This layer preferably likewise comprises one of the above-mentioned reflective metals of the vias or is made of the reflective metal. In plan view towards the bottom face of the semiconductor layer sequence, the current distribution element embodied in this way covers, for example, at least 60%, preferably at least 80%, more preferably at least 90% of the bottom face of the semiconductor layer sequence. It is also possible, however, that at most 60% or at most 50% or at most 40% of the bottom face is covered by the current distribution element, because sufficient current spreading can even then still be achieved.

Both the vias and the current distribution element can also comprise or be made of TCO materials in addition to, or instead of, metallic materials. It is possible in particular that the vias and/or the current distribution element comprise a plurality of layers made of TCO and metal.

According to at least one embodiment, the active layer of the semiconductor chip is designed to be continuous. In this embodiment, however, the active layer can comprise discontinuities, which are formed, for example, by the vias, which penetrate the active layer. The active layer preferably extends along the entire lateral extent of the semiconductor layer sequence or of the semiconductor chip, and, for instance, protrudes beyond the top face in all lateral directions in plan view towards the top face.

The lateral extent of the semiconductor chips and/or of the semiconductor layer sequence parallel to the active layer is at least 200 µm or at least 500 µm or at least 700 µm, for example. Alternatively or additionally, the lateral extent of the semiconductor chip equals at most 5 mm or at most 2.5 mm or at most 1 mm.

According to at least one embodiment, a first mirror layer is applied to the bottom face of the semiconductor layer sequence. The first mirror layer can form the bottom contact element of the semiconductor chip. Thus the mirror layer is preferably in direct contact with the semiconductor layer sequence.

According to at least one embodiment, in a cross-sectional view taken perpendicular to the active layer, at least part of the first mirror layer is arranged between the current distribution element and the bottom face. Thus at least in some places, preferably all over, the current distribution element is spaced apart from the bottom face of the semiconductor layer sequence and separated from the bottom face by the first mirror layer.

According to at least one embodiment, in plan view towards the top face, at least part of the first mirror layer is arranged between the vias. In other words, the vias extend from the current distribution element through the first mirror layer and penetrate through the first mirror layer in some places. Thus in plan view, some, preferably all, of the vias are partially or entirely surrounded by the first mirror layer.

According to at least one embodiment, the semiconductor layer sequence has side faces. The side faces bound the semiconductor layer sequence, preferably also the semiconductor chip, in a lateral direction.

According to at least one embodiment, the first mirror layer and/or the current distribution element do not protrude beyond the semiconductor layer sequence in a lateral direction, i.e., in plan view towards the bottom face of the semiconductor layer sequence the bottom face of the semiconductor layer sequence protrudes beyond the current distribution element and/or the first mirror layer in all lateral directions.

According to at least one embodiment, the first mirror layer and the current distribution element each have external edges. The external edges are defined as those edges that in each case lie closest to the side faces of the semiconductor layer sequence in a lateral direction.

According to at least one embodiment, some or all of the external edges of the first mirror layer are at least 2 µm, preferably at least 5 µm, more preferably at least 10 µm closer to the side faces of the semiconductor layer sequence than the external edges of the current distribution element.

The first mirror layer and the current distribution element preferably lie at different electrical potentials. An electrical field is thus formed between the external edges of the first mirror layer and of the current distribution element. Since the external edges of the current distribution element are set back from the external edges of the first mirror layer, the field strength between the external edges is reduced. In addition, the resultant electric field is preferably farther away from the side faces of the semiconductor layer sequence than in conventional semiconductor chips. In the event of moisture ingress into the semiconductor chip, the motive force for silver migration is thereby reduced, which in turn increases the lifetime of the semiconductor chip.

According to at least one embodiment, the vias in the semiconductor layer sequence have base faces. The base faces can run parallel to the active layer for instance. The electrical contact to the semiconductor layer sequence is made, for example, via the base faces, i.e., current can be injected from the vias through the base face into the semiconductor layer sequence, or in the opposite direction. For this purpose, the base faces are in indirect or direct contact with the semiconductor layer sequence.

According to at least one embodiment, an insulation layer is applied to the faces of the vias, apart from the base faces, and of the current distribution element. The insulation layer preferably encapsulates, apart from the base faces, all the faces of the vias and of the current distribution element, with the result that the vias and the current distribution element are electrically isolated from the first layer and in particular from the active layer of the semiconductor layer sequence. Thus in this case, current can flow between the vias and the semiconductor layer sequence only through the base faces.

The insulation layer preferably also isolates the first mirror layer electrically from the current distribution element and from the vias. For this purpose, the insulation layer can be arranged, for example, between the first mirror layer and the vias or respectively the current distribution element. The insulation layer is preferably in direct contact with the vias, the current distribution element and the first mirror layer.

The insulation layer preferably comprises or is made of a material that is transparent to radiation and/or light. For instance the insulation layer comprises a nitride such as silicon nitride, or an oxide such as silicon oxide.

In addition, the fabrication process can mean that the insulation layer is itself formed from two individual insulation layers. In this case, a first insulation layer is applied, for example, to the faces of the vias and to the faces of the current distribution element that face the semiconductor layer sequence. The first insulation layer is preferably made of silicon dioxide.

Furthermore, the first insulation layer, which then ensures in particular electrical isolation between the current distribution element and the first mirror layer, can also be applied to all the faces of the first mirror layer that face away from the semiconductor layer sequence.

A second insulation layer, which is preferably made of silicon nitride, can be applied to the faces of the current distribution element and of the first insulation layer, which faces face away from the semiconductor layer sequence.

According to at least one embodiment, a carrier is applied to the bottom face of the semiconductor layer sequence, which carrier is connected to the first mirror layer in particular in an electrically conducting manner. The carrier is preferably not in direct contact with the semiconductor layer sequence but is separated from the semiconductor layer sequence by the first mirror layer and by the first current distribution element. In order that the carrier can be connected to the first mirror layer in an electrically conducting manner, the insulation layer potentially applied to the sides of the first mirror layer that face away from the semiconductor layer sequence comprises discontinuities or apertures in one or more places. Current can flow unhindered from the carrier to the first mirror layer via these apertures in the insulation layer.

The carrier is a semiconductor substrate, for instance, which comprises or is made of silicon or germanium. The carrier also preferably comprises a heavily doped semiconductor material so that the carrier has a good electrical conductivity. This allows current to be injected via the carrier into the semiconductor chip and conducted to the bottom contact element. The carrier is preferably also responsible for the mechanical strength of the semiconductor chip and makes the semiconductor chip self-supporting.

According to at least one embodiment, a second mirror layer is applied between the first mirror layer and the carrier. The second mirror layer may in turn comprise or be made of a reflective metal such as silver, aluminum, gold or titanium. Likewise, TCO materials or combinations of TCO materials and metallic materials are possible.

According to at least one embodiment, the second mirror layer is made mainly or entirely of a different material from the first mirror layer. If the first mirror layer is made of silver, for instance, the second mirror layer can preferably be made of aluminum.

According to at least one embodiment, the second mirror layer is electrically isolated from the current distribution element by the insulation layer. For example, the second insulation layer isolates the current distribution element and the second mirror layer from each other, where the second insulation layer may be in direct contact both with the current distribution element and with the second mirror layer.

An electrical contact between the carrier and the first mirror layer is preferably made via the second mirror layer. For instance, the second mirror layer can be connected in an electrically conducting manner to the first mirror layer via the discontinuities or apertures in the insulation layer.

The second mirror layer is preferably applied over the surface of the bottom face of the semiconductor layer sequence. In plan view towards the bottom face, the second mirror layer thus covers the entire semiconductor layer sequence. In addition, the carrier can be applied to the second mirror layer by means of a solder material. The solder material is preferably a gold-free solder. The second mirror layer can also be deposited along with a solder barrier, which prevents chemical reactions between the first mirror layer and the solder material.

According to at least one embodiment, in plan view towards the bottom face, the first mirror layer covers at least 60%, preferably at least 80%, more preferably at least 90% of the bottom face of the semiconductor layer sequence. It is also possible, however, that at most 60% or at most 50% or at most 40% of the bottom face is covered by the first mirror layer. The first mirror layer is preferably used to reflect towards the top face most of the electromagnetic radiation generated in the active layer and hence to increase the efficiency of the semiconductor chip.

According to at least one embodiment, the top face of the semiconductor layer sequence is a textured radiation-out-coupling surface, via which is coupled out most of the radiation, preferably all of the radiation, generated in the semiconductor layer sequence. The textures can be embodied as roughening and are used to couple out efficiently the radiation generated in the semiconductor layer sequence.

According to at least one embodiment, a passivation layer that is preferably transparent to radiation and/or light is applied to the top face and to side faces of the semiconductor layer sequence. The passivation layer protects the semiconductor material from external influences such as moisture penetration. The passivation layer preferably completely encapsulates all exposed sides of the semiconductor layer sequence. In this case, the passivation layer can also comprise a plurality of individual layers. For instance, one or more or all the passivation layers are made of silicon nitride or comprise silicon nitride.

According to at least one embodiment, the lateral extent of the vias is at least 20 µm or at least 40 µm or at least 60

µm. Alternatively or additionally, the lateral extent of the vias is at most 100 µm or at most 80 µm or at most 70 µm.

According to at least one embodiment, the distance between two adjacent vias is, for some or all of the vias, at least 100 µm or at least 120 µm or at least 150 µm. Alternatively or additionally, the distance between two adjacent vias is at most 300 µm or at most 250 µm or at most 200 µm. The distance is understood to mean in particular the lateral distance parallel to the active layer.

According to at least one embodiment, in plan view towards the top face, the vias occupy, for example, at most 20% or at most 10% or at most 5% of the surface area of the top face. Alternatively or additionally, the vias occupy at least 1% or at least 2% or at least 4% of the surface area of the top face.

According to at least one embodiment, a current spreading layer, which is heavily doped with the second conductivity type, is applied between the second layer of the semiconductor layer sequence and the top face. The heavily doped current spreading layer comprises, for example, the same semiconductor material as the second layer, preferably also having a particularly high conductivity, in particular transverse conductivity, and can distribute the current efficiently over the lateral extent of the semiconductor layer sequence. The vias and/or the top contact element preferably extend into the current spreading layer, i.e., current can flow directly between the vias and the current spreading layer without having to pass through further semiconductor layers that may have a poorer conductivity. The resistance of the current spreading layer in a direction parallel to the bottom face is, for example, at least 10 times or 1000 times or 100000 times greater than the corresponding resistance of the current distribution element. In particular, the transverse conductivity of the current spreading layer is at least 10 times or 1000 times or 100000 times greater than the transverse conductivity of the rest of the semiconductor layer sequence.

The current spreading layer integrated into the semiconductor layer sequence then ensures, in addition to the current distribution element applied to the bottom face, improved distribution of the current injected via the top contact element.

The current spreading layer can comprise, for example, the same semiconductor material as the second layer and merely be more heavily doped than the second layer.

According to at least one embodiment, in plan view towards the top face, some, preferably all, of the vias have the same diameter. It is also possible that the vias are arranged in the form of an array, in particular in the form of a grid, in order to ensure uniform current distribution.

According to at least one embodiment, the first vias of the vias have a larger lateral extent than the second vias of the vias. In this case, the first vias of the vias are preferably arranged closer to the top contact element than the second vias of the vias.

According to at least one embodiment, a mirror element is disposed onto the bottom face of the semiconductor layer sequence, which mirror element, in plan view towards the top face, is covered at least partially by the top contact element. The mirror element is preferably not in direct electrical contact with the bottom contact element.

Thus the semiconductor layer sequence preferably does not generate any electromagnetic radiation in the region of the mirror element. This is advantageous because in this region, the top face of the semiconductor layer sequence is covered anyway by the preferably radiation-opaque top contact element. The mirror element, however, still reflects radiation coming from the semiconductor layer sequence back towards the top face.

According to at least one embodiment, the semiconductor chip comprises a further via, which extends from the current distribution element into the semiconductor layer sequence. In plan view towards the top face, the further via is covered at least partially by the top contact element. In other words, in cross-sectional view, the further via is arranged directly beneath the top contact element. Current injected from the top contact element into the semiconductor layer sequence can thereby be conducted particularly quickly to the current distribution element, i.e., without having to pass through a large amount of semiconductor material.

BRIEF DESCRIPTION OF THE DRAWINGS

An optoelectronic semiconductor chip described here is explained in greater detail below using exemplified embodiments with reference to the drawings. The same reference signs denote here the same elements in each of the figures. Any reference to scale is not given, however, and indeed individual elements may be shown exaggeratedly large in order to improve understanding.

In the drawings:

FIGS. 2A to 2E are schematic plan views of a semiconductor chip described here.

DETAILED DESCRIPTION OF ILLUSTRATIVE EMBODIMENTS

Figure 1:
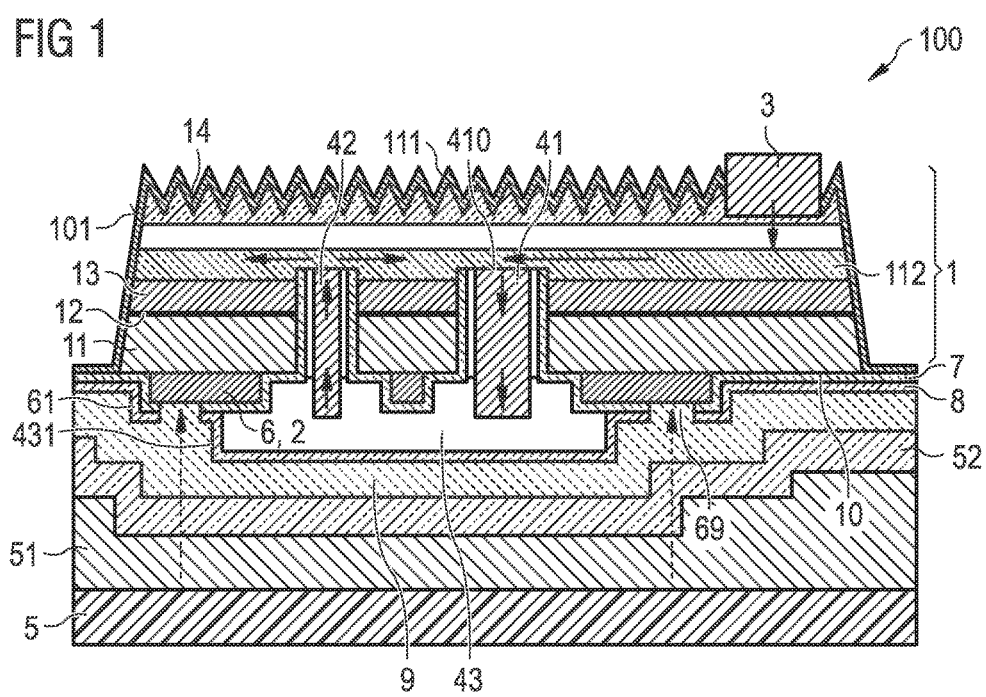
FIGS. 1 and 3 are schematic cross-sectional diagrams of exemplified embodiments of a semiconductor chip described here.

The exemplified embodiment of FIG. 1 shows a semiconductor chip 100 in cross-section. The semiconductor chip comprises a semiconductor layer sequence 1 having a bottom face 10 and a top face 14, which is opposite the bottom face 10. A first layer 11 of a first conductivity type adjoins the bottom face 10. A second layer 13 of a second conductivity type is applied to the first layer 11. In addition, an active layer 12 is formed between the first layer 11 and the second layer 13. Furthermore, a current spreading layer 112 is located between the second layer 13 and the top face 14. The semiconductor layer sequence 1 can be based on GaN, for instance. The first layer 11 is, for instance, a p-type layer, the second layer 13 is an n-type layer, and the current spreading layer 112 is a heavily doped n-type layer. It is also possible, however, for the p-type and n-type doping to be swapped over.

In FIG. 1, the top face 14 of the semiconductor layer sequence 1 is a radiation-outcoupling surface, which is textured in order to couple out radiation more efficiently. Both the top face 14 and side faces 101 of the semiconductor layer sequence 1 are covered by a passivation layer 111, which encapsulates the semiconductor layer sequence 1 and protects it from external influences.

Applied on the top face 14 of the semiconductor layer sequence 1 is additionally a top contact element 3, which comprises, for example, a metal such as gold, silver or titanium, and extends into the semiconductor layer sequence 1. The top contact element 3 is also in direct contact with the semiconductor layer sequence 1.

Disposed on the bottom face 10 of the semiconductor layer sequence 1 is additionally a bottom contact element 2. In the example of FIG. 1, the bottom contact element 2 is in the form of a first mirror layer 6, which is applied over the surface of the bottom face 10. The first mirror layer 6 is here made of silver, for example.

In FIG. 1, there is also a current distribution element 43 applied to the bottom face 10, with the result that at least part of the mirror layer 6 is enclosed between the current distribution element 43 and the semiconductor layer sequence 1. Again, the current distribution element 43 is applied over the surface of the bottom face 10, and, in plan view towards the bottom face 10, covers 60% of the surface area of the bottom face 10 for example.

A plurality of vias 41, 42 extend from the current distribution element 43 through the first layer 11 and the active layer 12 into the semiconductor layer sequence 1. In FIG. 1, the vias 41, 42 are cylindrical in shape, with base faces of the cylinders forming base faces 410 of the vias 41, 42. The base faces 410 extend within the current distribution layer 112 parallel to the active layer 12.

In the present example, the vias 41, 42 are filed with silver, for example, and the current distribution element 43 is in the form of a silver layer, for instance.

For the purpose of electrical isolation, a first insulation layer 7 is applied to side faces, or more precisely lateral surfaces, of the vias 41, 42 and to the faces of the current distribution element 43 that face the semiconductor layer sequence 1. The first insulation layer 7 comprises silicon dioxide, for instance, and electrically isolates the vias 41, 42 from the semiconductor layer sequence 1, in particular from the active layer 12, with the result that there is no direct electrical contact between the active layer 12 and the vias 41, 42.

The base faces 410 of the vias 41, 42 are not covered by the first insulation layer 7. In addition, the first insulation layer 7 is arranged between the first mirror layer 6 and the current distribution element 43, and isolates the layer from the element. In FIG. 1, the first insulation layer 7 covers all the sides of the first mirror layer 6 that face away from the semiconductor layer sequence 1.

A second insulation layer 8, which comprises silicon nitride, for example, is applied to the sides of the current distribution element 43 and of the mirror layer 6, which sides face away from the semiconductor layer sequence 1. In FIG. 1, a second mirror layer 9, which comprises aluminum, for example, is applied to the face of the second insulation layer 8 that faces away from the semiconductor layer sequence 1. The first mirror layer 6 is in direct electrical contact with the second mirror layer 9 via discontinuities or apertures 69 in the first insulation layer 7 and in the second insulation layer 8.

In the exemplified embodiment of FIG. 1, applied to a face of the second mirror layer 9 that faces away from the semiconductor layer sequence 1 is additionally a carrier 5, which, for example, is electrically conductive and is made of heavily doped silicon or germanium. The carrier 5 is mechanically joined to the semiconductor layer sequence 1 by means of a solder 51, preferably by means of a gold-free solder 51. The solder 51 also constitutes an electrical contact between the carrier 5 and the second mirror layer 9. A solder barrier 52 is additionally applied in the form of a layer between the solder 51 and the second mirror layer 9.

In FIG. 1, the first mirror layer 6 also comprises an external edge 61, which is set back from the side face 101 of the semiconductor layer sequence 1. Likewise, the current distribution element 43 comprises an external edge 431, which likewise is set back from the side face 101 of the semiconductor layer sequence 1. In the present example, the external edge 431 of the current distribution element 43 is at least 5 μm further away from the side face 101 than the external edge 61 of the first mirror layer 6.

As shown in FIG. 1 by the dashed arrows, current can get from the carrier 5 to the first mirror layer 6 via the solder 51, the solder barrier 52 and the second mirror layer 9 by means of the apertures 69, with the first mirror layer 6 being embodied as the bottom contact element 2, via which the current is injected into the semiconductor layer sequence 1.

Using the continuous arrows, FIG. 1 also illustrates how the current is distributed that is fed into the semiconductor layer sequence 1 via the top contact element 3. The current initially flows along the semiconductor layer sequence 1, preferably along the current distribution layer 112. Some of this current is conducted through first vias 41 of the vias towards the bottom face 10 into the current distribution element 43, where the current is distributed along the bottom face 10. The current is then conducted by means of second vias 42 of the vias back towards the top face 14, and there re-injected into the semiconductor layer sequence 1. Thus the current distribution element 43 preferably distributes the current injected by the top contact element 3 such that the active layer 12 generates electromagnetic radiation along its entire lateral extent.

The exemplified embodiment of FIG. 2A shows, in plan view towards the top face 14, a semiconductor chip 100 described here. The semiconductor chip 100 has a square design and has a lateral extent of 500 μm, for example. The top contact element 3 is arranged only in one corner of the semiconductor chip 100, leaving most of the top face 14 uncovered.

FIG. 2A also shows a plurality of vias 41, 42, which all have the same lateral extent or a lateral extent of similar size, for example of at most 70 μm. In this figure it is the base faces 410 in particular that are visible of the cylindrical vias 41, 42. In plan view, the vias 41, 42 are entirely surrounded by the first insulation layer 7. In addition, the vias 41, 42 are arranged in the form of an array, in particular in the form of a grid.

In FIG. 2A, the first mirror layer 6, which acts as the bottom contact element 2, is visible between the vias 41, 42. The first mirror layer 6 is designed to be continuous and covers at least 80% of the bottom face 10 of the semiconductor layer sequence 1. Solely the vias 41, 42 present discontinuities in parts of the mirror layer 6, which entirely encircles the vias 41, 42. In FIG. 2A, the region beneath the top contact element 3 is not covered by the first mirror layer 6.

Unlike the exemplified embodiment of FIG. 2A, the exemplified embodiment of FIG. 2B shows vias 41, 42 of different size, where first vias 41 of the vias have a larger lateral extent, i.e., a larger diameter, than second vias 42 of the vias. All the first vias 41 of the vias are arranged closer to the top contact element 3 than the second vias 42 of the vias.

Figure 2C:
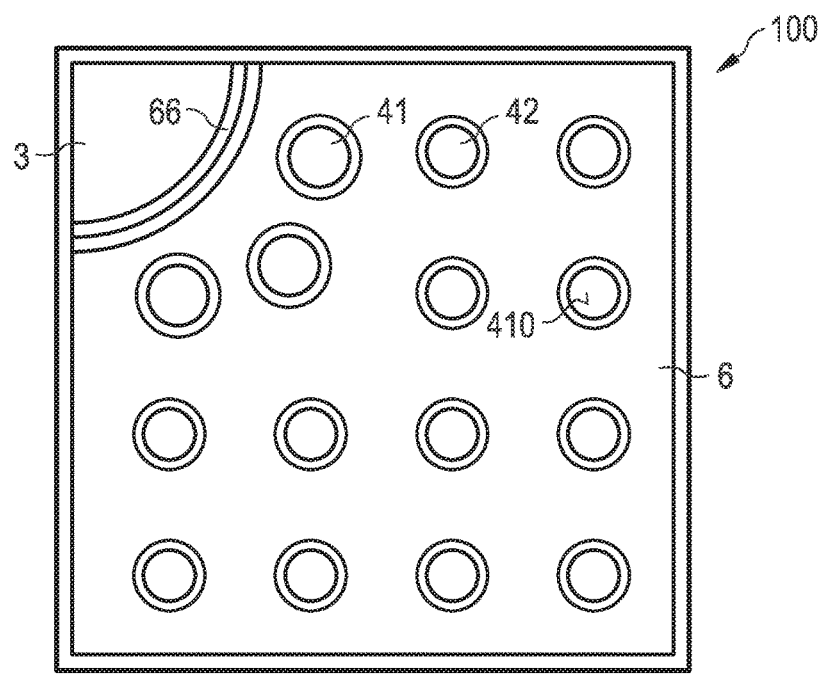

The exemplified embodiment of FIG. 2C differs from the exemplified embodiment of FIG. 2B in that a mirror element 66 is arranged on the bottom face 10 of the semiconductor layer sequence 1. The mirror element 66, in the plan view of FIG. 2C, is partially covered by the top contact element 3. FIG. 2C also shows that the mirror element 66 is electrically isolated from the first mirror layer 6, i.e., for exam there is no direct electrical contact between the mirror element 66 and the first mirror layer 6. The mirror element 66 is used to reflect back at the bottom face 10, the portion of the radiation emitted by the active layer 12 that is directed towards the underneath of the top contact element 3, and to direct the portion of radiation towards the top face 14.

Figure 2D:
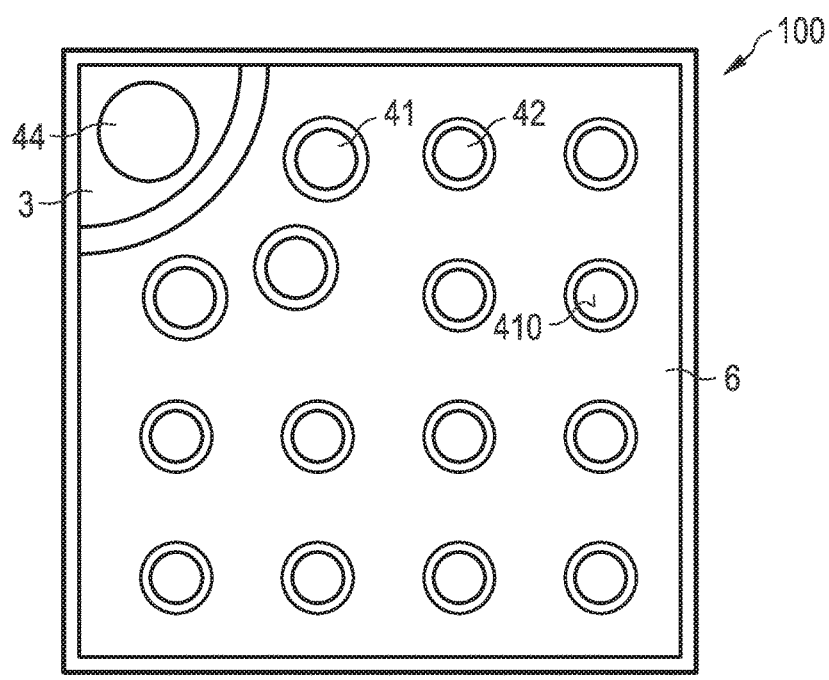

In contrast with FIG. 2B, in the exemplified embodiment of FIG. 2D, a further via 44 is introduced into the semiconductor layer sequence 1. In plan view towards the top face 14, the further via 44 is arranged directly beneath the top contact element 3, in particular the top contact element 3 covers the further via 44 entirely in plan view. Current injected by the first contact element 3 can be conducted towards the bottom face 10 into the current distribution element 43 particularly efficiently through the further via 44.

Figure 2E:
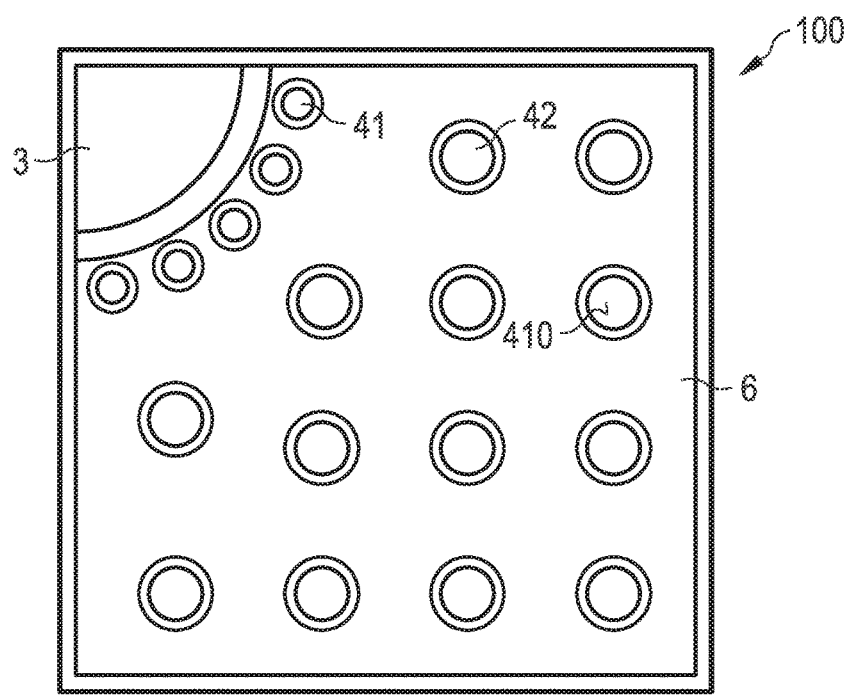

The exemplified embodiment of FIG. 2E differs from the exemplified embodiments of FIGS. 2A to 2D in that the first vias 41 of the vias have a smaller diameter than the second vias 42 of the vias. All the first vias 41 of the vias are in this case arranged closer to the top contact element 3 than the second vias 42 of the vias. In particular, the first vias 41 of the vias surround the top contact element 3. In this case, for example, the first vias 41 of the vias have at most half as large a diameter as the second vias 42 of the vias. In addition, the distance between the first vias 41 of the vias is less than the distance between the second vias 42 of the vias. For example, the distance between the first vias 41 of the vias is at most 150 µm or at most 100 µm or at most 50 µm.

Figure 3:
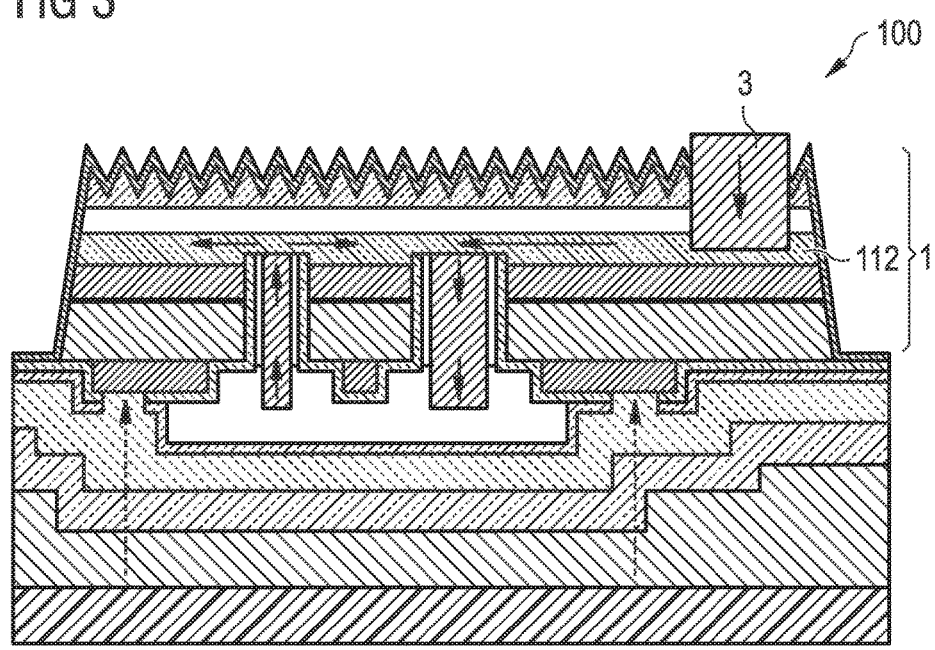

The exemplified embodiment of FIG. 3 differs from the exemplified embodiment of FIG. 1 in that the top contact element 3 penetrates further into the semiconductor layer sequence 1, if applicable penetrates additional semiconductor layers or additional semiconductor material, and terminates in the current spreading layer 112. Such an embodiment ensures that the current is injected particularly efficiently and current is subsequently distributed by means of the current distribution layer 112.

The invention described here is not restricted by the description based on the exemplified embodiments. Instead, the invention includes every novel feature and every combination of features, which in particular includes every combination of features in the claims, even if this feature or combination is not itself explicitly mentioned in the claims or exemplified embodiments.

The invention claimed is:

1. An optoelectronic semiconductor chip comprising:
a semiconductor layer sequence having a bottom face and a top face opposite the bottom face, wherein the semiconductor layer sequence comprises a first layer of a first conductivity type, an active layer for generating electromagnetic radiation, and a second layer of a second conductivity type, arranged in this order viewed from the bottom face;
a bottom contact element located at the bottom face and a top contact element located at the top face for injecting current into the semiconductor layer sequence;
a current distribution element located at the bottom face, the current distribution element distributes current along the bottom face during operation; and
a plurality of vias extending from the current distribution element through the first layer and through the active layer into the semiconductor layer sequence, wherein the vias are not in direct electrical contact with the active layer, and wherein, when current is injected via the top contact element into the semiconductor layer sequence during operation, at least some current flows towards the bottom face via first vias of the vias and distributes via the current distribution element such that the current flows via second vias of the vias towards the top face and is re-injected into the semiconductor layer sequence.

2. The optoelectronic semiconductor chip as claimed in claim 1, wherein at least some of the vias are holes in the semiconductor layer sequence filled with a reflective metal, and wherein the current distribution element comprises a reflective metal.

3. The optoelectronic semiconductor chip as claimed in claim 1, wherein the active layer of the optoelectronic semiconductor chip is a continuous layer.

4. The optoelectronic semiconductor chip as claimed in claim 1, wherein the bottom contact element comprises a first mirror layer, wherein at least part of the first mirror layer, in cross-sectional view, is arranged between the current distribution element and the bottom face, and wherein at least part of the first mirror layer, in plan view towards the bottom face, extends between the vias.

5. The optoelectronic semiconductor chip as claimed in claim 4, wherein the semiconductor layer sequence comprises side faces, wherein the first mirror layer and the current distribution element do not protrude beyond the semiconductor layer sequence in a lateral direction parallel to the active layer, wherein the first mirror layer and the current distribution element each have external edges, wherein the external edges are those edges that in each case lie closest to the side faces of the semiconductor layer sequence, and wherein the external edges of the first mirror layer are at least 2 µm closer to the side faces than the external edges of the current distribution element.

6. The optoelectronic semiconductor chip as claimed in claim 1, wherein the vias in the semiconductor layer sequence comprise first base faces forming an electrical contact with the semiconductor layer sequence, and wherein an insulation layer encapsulates, apart from the first base faces and second base faces opposite to the first base faces, faces of the vias and of the current distribution element thereby electrically insolating the vias and the current distribution element from the first layer and from the active layer.

7. The optoelectronic semiconductor chip as claimed in claim 1, further comprising a carrier located at the bottom face of the semiconductor layer sequence, wherein the carrier is connected to the bottom contact element in an electrically conducting manner.

8. The optoelectronic semiconductor chip as claimed in claim 7, further comprising a second mirror layer located between the bottom contact element comprising a first mirror layer and the carrier, wherein the second mirror layer comprises a different material from the first mirror layer, wherein the second mirror layer is electrically isolated from the current distribution element by an insulation layer, and wherein the second mirror layers forms an electrical contact between the carrier and the first mirror layer.

9. The optoelectronic semiconductor chip as claimed in claim 1, wherein, in plan view towards the bottom face, the bottom contact element covers at least 60% of the bottom face, wherein the top face of the semiconductor layer sequence is a textured radiation-outcoupling surface, and wherein a passivation layer is located at the top face and at side faces of the semiconductor layer sequence.

10. The optoelectronic semiconductor chip as claimed in claim 1, wherein a lateral extent of the vias parallel to the active layer is between 20 µM and 100 µm inclusive, and wherein a distance between two adjacent vias equals at least 100 µm.

11. The optoelectronic semiconductor chip as claimed in claim 1, further comprising a current spreading layer located between the second layer and the top face of the semiconductor layer sequence, the current spreading layer being heavily doped with a second conductivity type, and wherein the vias and/or the top contact element extend into the current spreading layer such that they electrically connect to one another.

12. The optoelectronic semiconductor chip as claimed in claim 1, wherein, in plan view towards the top face, the vias have the same diameter, and in plan view towards the top face, are arranged in form of an array.

13. The optoelectronic semiconductor chip as claimed in claim 1, wherein the first vias of the vias have a larger lateral extent than the second vias of the vias, and wherein the first vias of the vias are arranged closer to the top contact element.

14. The optoelectronic semiconductor chip as claimed in claim 1, further comprising a mirror element located at the bottom face, wherein the mirror element, in plan view towards the top face, is covered at least partially by the top contact element, and wherein the mirror element is not in direct electrical contact with the bottom contact element.

15. An optoelectronic semiconductor chip as claimed in claim 1, wherein a further via extends from the current distribution element into the semiconductor layer sequence, and wherein, in plan view towards the top face, the further via is covered at least partially by the top contact element.

16. An optoelectronic semiconductor chip comprising:
 a semiconductor layer sequence having a bottom face and a top face opposite the bottom face, wherein the semiconductor layer sequence comprises a first layer of a first conductivity type, an active layer for generating electromagnetic radiation, and a second layer of a second conductivity type, arranged in this order viewed from the bottom face;
 a bottom contact element located at the bottom face, and a top contact element located at the top face for injecting current into the semiconductor layer sequence, wherein the top contact element extends into the semiconductor layer sequence without crossing the active layer;
 a current distribution element located at the bottom face, the current distribution element distributes current along the bottom face during operation;
 a plurality of vias extending from the current distribution element through the first layer and through the active layer into the semiconductor layer sequence, wherein the vias are not in direct electrical contact with the active layer, and wherein, when current is injected via the top contact element into the semiconductor layer sequence during operation, at least some current flows towards the bottom face via first vias of the vias and distributes via the current distribution element such that the current flows via second vias of the vias towards the top face and is re-injected into the semiconductor layer sequence.

* * * * *

UNITED STATES PATENT AND TRADEMARK OFFICE
CERTIFICATE OF CORRECTION

PATENT NO. : 9,917,230 B2
APPLICATION NO. : 15/315376
DATED : March 13, 2018
INVENTOR(S) : Alexander F. Pfeuffer et al.

It is certified that error appears in the above-identified patent and that said Letters Patent is hereby corrected as shown below:

In the Claims

In Column 12, Line 50, Claim 8, delete "the second mirror layers forms" and insert --the second mirror layer forms--.

In Column 12, Line 61, Claim 10, delete "20 µM" and insert --20 µm--.

Signed and Sealed this
Nineteenth Day of June, 2018

Andrei Iancu
*Director of the United States Patent and Trademark Office*